United States Patent
Marumoto et al.

(10) Patent No.: US 7,286,422 B2
(45) Date of Patent: Oct. 23, 2007

(54) MEMORY DEVICE WITH BUILT-IN TEST FUNCTION AND METHOD FOR CONTROLLING THE SAME

(75) Inventors: Kyoji Marumoto, Kyoto (JP); Yo Sawamura, Kyoto (JP); Tatsuhiko Murata, Kyoto (JP); Yoshiaki Suenaga, Kyoto (JP)

(73) Assignee: Rohm Co., Ltd. (JP)

( * ) Notice: Subject to any disclaimer, the term of this patent is extended or adjusted under 35 U.S.C. 154(b) by 0 days.

(21) Appl. No.: 11/146,339

(22) Filed: Jun. 6, 2005

(65) Prior Publication Data

US 2005/0219886 A1 Oct. 6, 2005

Related U.S. Application Data

(63) Continuation of application No. PCT/JP2004/010860, filed on Jul. 29, 2004.

(30) Foreign Application Priority Data

Nov. 6, 2003 (JP) .............................. 2003-377503

(51) Int. Cl.
*G11C 7/00* (2006.01)
*G11C 29/00* (2006.01)
(52) U.S. Cl. ....................... 365/201; 365/200
(58) Field of Classification Search ............... 365/201, 365/200; 345/530
See application file for complete search history.

(56) References Cited

U.S. PATENT DOCUMENTS 5,265,055 A * 11/1993 Horiguchi et al. .......... 365/200
5,631,868 A * 5/1997 Termullo et al. ........... 365/200
6,438,044 B2 * 8/2002 Fukuda ...................... 365/200

FOREIGN PATENT DOCUMENTS

| JP | 08152867 A | * | 6/1996 |
| JP | 10-049448 | | 2/1998 |
| JP | 2001-023391 | | 1/2001 |
| JP | 2001-266589 | | 9/2001 |
| JP | 2001-352038 | | 12/2001 |
| JP | 2002-032996 | | 1/2002 |

OTHER PUBLICATIONS

Office Action for corresponding Japanese Patent Application No. 2003-377503 with English abstract dated May 23, 2006.
International Preliminary Report on Patentability for International Application No. PCT/JP2004/010860 mailed Aug. 3, 2006.
Japanese Office Action for Application No. 2003-377503 Date: Sep. 5, 2006.
Office Action for corresponding Chinese Patent Application No. 200480001746.9 issued Jun. 8, 2007 with English translation.

* cited by examiner

*Primary Examiner*—Van Thu Nguyen
*Assistant Examiner*—Allison P Bernstein
(74) *Attorney, Agent, or Firm*—Cantor Colburn LLP

(57) ABSTRACT

A test circuit employs hardware to test a memory cell in a memory block. The address of an error cell detected is stored in a first or second error address register. Access made by a processor to the address of the error cell would be detected by a first or second address comparator. Data is then written to a first or second correction register, which serves as an alternative cell, or data is read from one of the registers.

13 Claims, 7 Drawing Sheets

MEMORY DEVICE WITH BUILT-IN TEST FUNCTION AND METHOD FOR CONTROLLING THE SAME

CROSS-REFERENCE TO RELATED APPLICATION

The present application is a continuation of PCT/JP2004/010860, filed on Jul. 29, 2004, the entire contents of which are incorporated herein by reference, and which claims the benefit of the date of the earlier filed Japanese Patent Application No. JP 2003-377503 filed on Nov. 6, 2003.

BACKGROUND OF THE INVENTION

1. Field of the Invention

An embodiment of the present invention relates to memory devices and the related technologies thereof, and more particularly to a memory device with a built-in test function and a method for controlling the memory device as well as to a display device incorporating the memory device.

2. Description of the Related Art

These days, large-capacity memories are indispensable to the construction of systems. With increasing user requirements for systems which can realize further diversified functions with higher performance as well as in a further simplified form, there is an ever-growing demand for larger-capacity memories. However, with increases in memory capacity, problems such as a defect or failure in a memory cell naturally become noticeable. The presence of a defective or failed memory cell (hereinafter simply referred to as an "error cell") would cause an abnormal operation or other drawbacks of a system.

A conventional method known as parity check has been employed for detecting an error cell. Depending on how to add a parity bit or a redundant bit to a predetermined bit length, the parity check may allow either only an error cell to be detected or an error cell to be not only detected but also corrected. For example, in Japanese Patent Laid-Open Publication No. Hei 10-49448, a technique is disclosed which utilizes the parity check to correct an error before a memory with redundancy is driven into an uncorrectable condition.

SUMMARY OF THE INVENTION

The parity check makes it possible to detect and correct an error cell but requiring low redundancy by no means to this end, thereby impeding the memory to be increased in capacity. Furthermore, the time required for calculating a parity bit may impose a limitation to the access time of the memory. An embodiment of the present invention was developed in view of the aforementioned problems. It is therefore an embodiment of the invention to provide a memory device which is well-suited for being increased in capacity and its related technologies.

A memory device according to an embodiment of the present invention comprises: a memory block having an arrangement of memory cells; a test circuit which performs a self-test of the memory cells; an alternative cell which replaces a memory cell which has been found to be erroneous as a result of the self-test; and a bypass circuit which switches access to the erroneous memory cell to access to the alternative cell. In one embodiment, this memory device may be a one-chip LSI. In this case, the LSI may be used only as a memory or may include a memory as well as any system or control circuit which employs the memory.

The alternative cell may be made up of a register circuit which is provided external to the memory block. This configuration requires, e.g., only a few alternative cells for a memory block, thus making it possible to reduce redundancy when compared to the parity scheme that requires a redundant bit for each predetermined bit length.

According to an embodiment of the present invention, in the memory device the bypass circuit comprises: an error address storage circuit which stores the address of the erroneous memory cell; a comparator circuit which compares a currently accessed address with an address stored in the error address storage circuit; and a switching circuit which changes an access destination to the alternative cell when there is a match between both the addresses to be compared in the comparator circuit.

Another embodiment of the present invention is a display device. The display device comprises a display memory and a control circuit which reads data from the display memory for display. The display memory comprises: a memory block having an arrangement of memory cells; a test circuit which performs a self-test of the memory cells; an alternative cell which replaces a memory cell which has been found to be erroneous as a result of the self-test; and a bypass circuit which switches access to the erroneous memory cell to access to the alternative cell. Since the presence of even one bit of error cell in a display memory would be recognized by the user, the display memory according to this embodiment of the invention would effectively replace the error cell.

Still another embodiment of the present invention is a memory control method. The method comprises: performing a self-test on a memory cell in a memory device in accordance with a predetermined condition for starting the test before the memory device is brought into service; enabling an alternative cell, when an error is detected in the self-test, in place of a memory cell having the error detected; and switching an access destination to the alternative cell when access is made to the memory cell having the error detected.

Incidentally, any combinations of the foregoing components, and the expressions of an embodiment of the present invention converted among methods, apparatuses, circuits, and the like are also intended to constitute applicable aspects of an embodiment of the present invention.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

Embodiments will now be described, by way of example only, with reference to the accompanying drawings which are meant to be exemplary, not limiting, and wherein like elements are numbered alike in several Figures, in which:

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
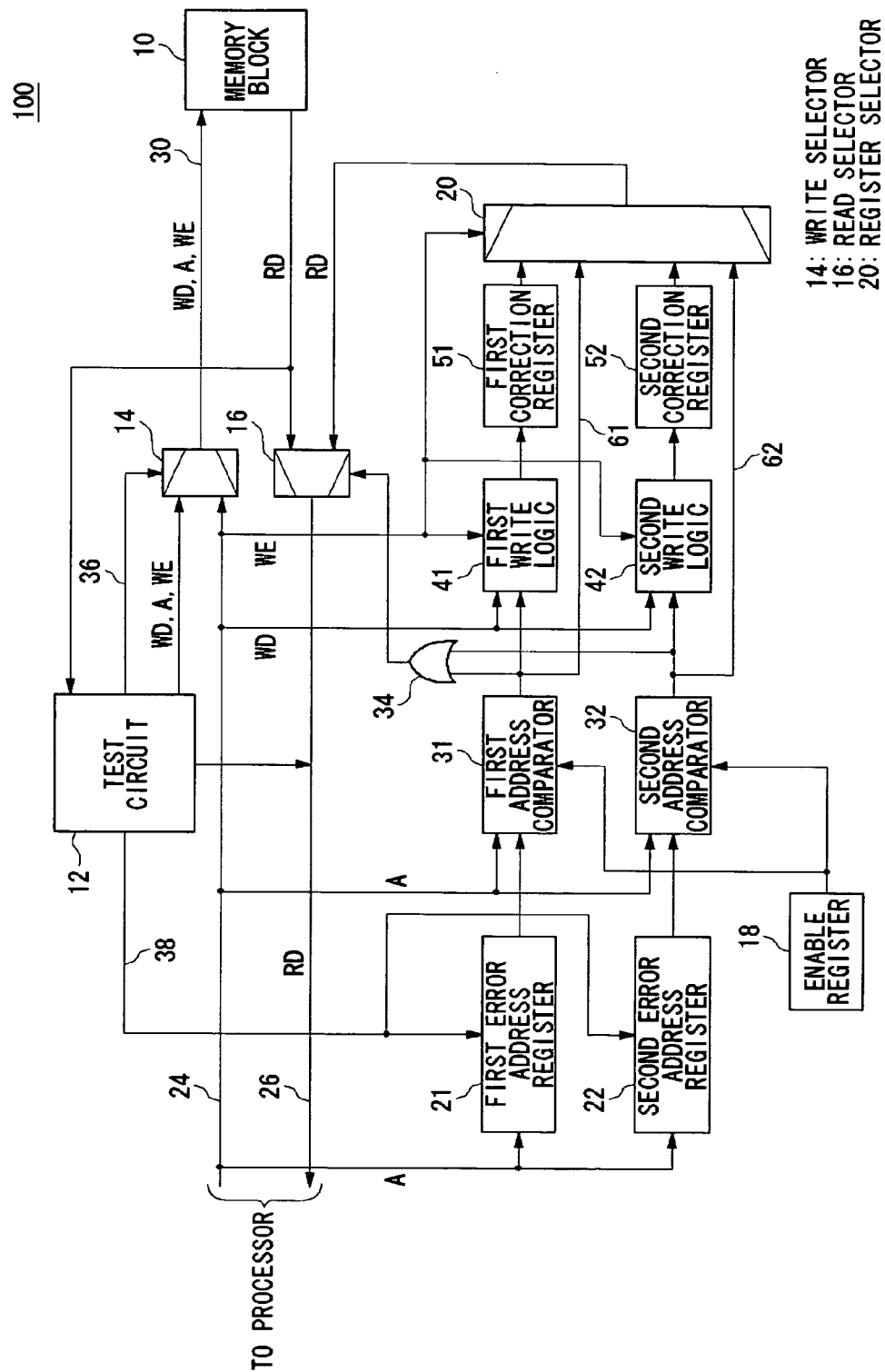
FIG. 1 is a view showing the configuration of a memory device according to an embodiment.

FIG. 1 shows the configuration of a memory device 100 according to an embodiment. An entity for reading and writing data on the memory device 100 is hereinafter referred to as a "processor." This embodiment includes only the memory device 100, or the memory device 100 and a processor in one integrated circuit device, i.e., an LSI. In FIG. 1, the following generic symbols will be used as appropriate for convenience in writing: "WD" denoting write data, "WE" denoting a command signal indicative of write at High and read at Low, "A" denoting an address, and "RD" denoting read data.

A memory block 10 may be an SRAM or any other RAM which includes a number of memory cells. A test circuit 12 is a circuit for a so-called BIST (Built-In Self-test), in which a write selector 14 switches between a path for the test circuit 12 to write test data onto the memory block 10 and a normal write access path. The processor provides normal write access using a write bus 24. The write bus 24 carries "WD," "A," and "WE." A write memory bus 30 connects between the write selector 14 and the memory block 10, carrying "WD," "A," and "WE." The test circuit 12 supplies "WD," "A," and "WE" for use with a test to the write selector 14 in conjunction with a test signal 36 indicating that the test is being made. When the test signal 36 is active, the "WD," "A," and "WE" delivered from the test circuit 12 are supplied to the memory block 10 via the write selector 14. On the other hand, when the test signal 36 is inactive, write data from the processor is supplied to the memory block 10 via the write selector 14.

A read selector 16 selects one of read data from the memory block 10 and alternative data, discussed later, and then returns the resulting data to the processor via a read bus 26.

A first error address register 21 and a second error address register 22 store a memory address (hereinafter simply referred to as an "error address") at which an error has been detected as a result of a BIST performed by the test circuit 12. At the time of detection of an error, the test circuit 12 asserts an error detection signal 38, which will serve as a write trigger. There is provided a two-circuit system which is made up of the first and second error address registers 21 and 22. As detailed later, this is because the memory block 10 is divided into a plurality of regions so that the first error address register 21 serves a first region and the second error address register 22 serves a second region. More specifically, when an error is found while testing the first region, the test circuit 12 asserts the error detection signal 38 for the first error address register 21 and negates the error detection signal 38 for the second error address register 22. Since each circuit of the system has the same configuration, an explanation will be given below only to the first circuit.

An error address stored in the first error address register 21 is delivered to a first address comparator 31. When the memory block 10 is accessed by the processor, the first address comparator 31 monitors the address, and if the address matches the error address, then asserts a first error cell access signal 61 indicative of access being made to an erroneous memory cell (hereinafter simply referred to as an "error cell"). An enable register 18 prohibits or permits the operation of the first address comparator 31 itself. When the operation is prohibited, the first error cell access signal 61 is not asserted.

A first write logic circuit 41 is a logic circuit, which receives "WE," "WD," and the first error cell access signal 61. For "WD," the first write logic circuit 41 includes a latch or buffer circuit (not shown) as required for timing control purposes, but may also be a through-circuit. For simplicity of description, a through-circuit is employed in the embodiment. When "WE" is active, i.e., in a write cycle and when the first error cell access signal 61 is asserted, the first write logic circuit 41 writes the current "WD" to a first correction register 51. Instead of writing of write data to the error cell, this realizes writing of write data to the first correction register 51 which serves as an alternative cell. Data stored in an alternative cell will be hereinafter referred to also as "alternative data."

On the other hand, when an error address is accessed for a read operation, no write operation will be performed on the first correction register 51. Instead, the alternative data stored in the first correction register 51 is returned to the processor via a register selector 20 and the read selector 16. For this reason, the read data from the memory block 10 is ignored, so that the error address is completely replaced by the alternative cell. The register selector 20 refers to the first error cell access signal 61 and a second error cell access signal 62 to determine which correction register data to select. When the first error cell access signal 61 or the second error cell access signal 62 is asserted, an OR gate 34 outputs a High, thereby causing the read selector 16 to select an output of the register selector 20 for output to the read bus 26.

Figure 2:
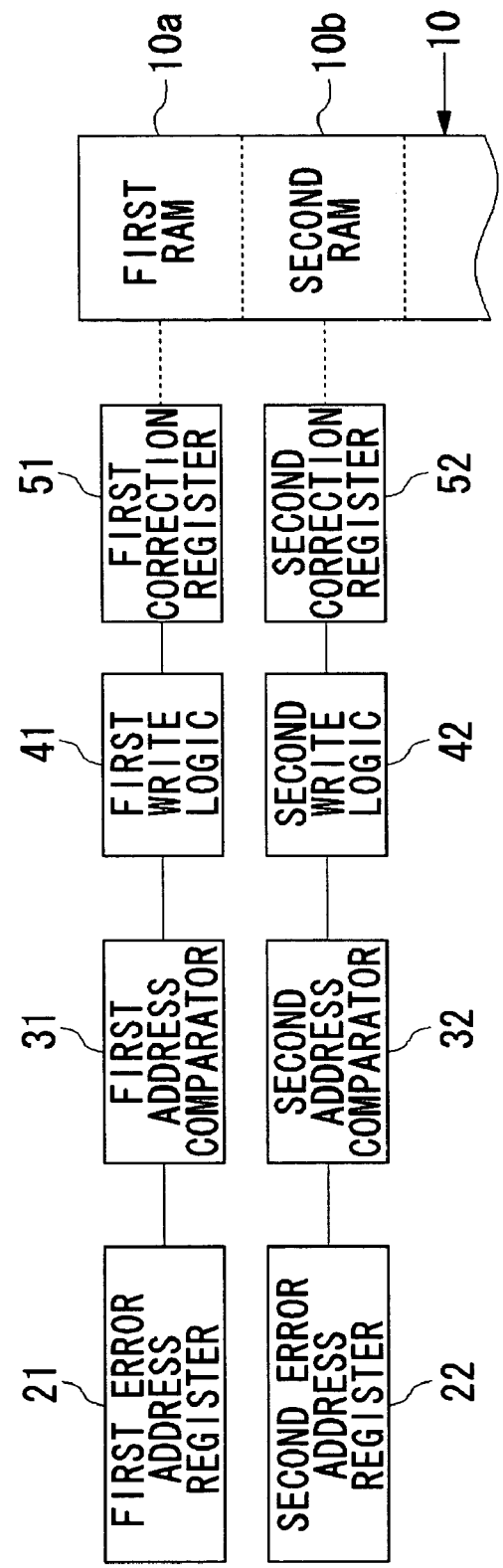
FIG. 2 is a view showing the relation between a first alternative cell path, a second alternative cell path, and a memory block in their internal configuration.

FIG. 2 shows the relation between the first alternative cell path, the second alternative cell path, and the memory block 10 in their internal configuration. As shown, the first alternative cell path includes the first error address register 21, the first address comparator 31, the first write logic circuit 41, and the first correction register 51. The second alternative cell path includes the second error address register 22, a second address comparator 32, a second write logic circuit 42, and a second correction register 52. These alternative cell circuits may be considered to be a "bypass circuit" which bypasses access to the memory block 10 for error recovery.

As shown, the first and second alternative cell paths correspond to a first RAM 10a and a second RAM 10b, or the first and second regions, respectively. The memory block 10 may include a plurality of separate RAMs, in the case of which an alternative cell can be prepared for each RAM. For example, in preparing an alternative cell for individual RAMs, there is a merit that an alternative cell and a related circuit can be placed in proximity to each RAM. For the RAMs each having a different size, the number of alternative cells may be determined depending on the size. For example, alternative cells may be provided generally proportionally, e.g., two alternative cells for an 8-kilo-byte RAM or four alternative cells for a 16-kilo-byte RAM. This is because the number of error cells is considered to be proportional to the size of RAM. FIG. 2 shows more than two RAMs, but FIG. 1 shows two of the RAMs.

Figure 3:
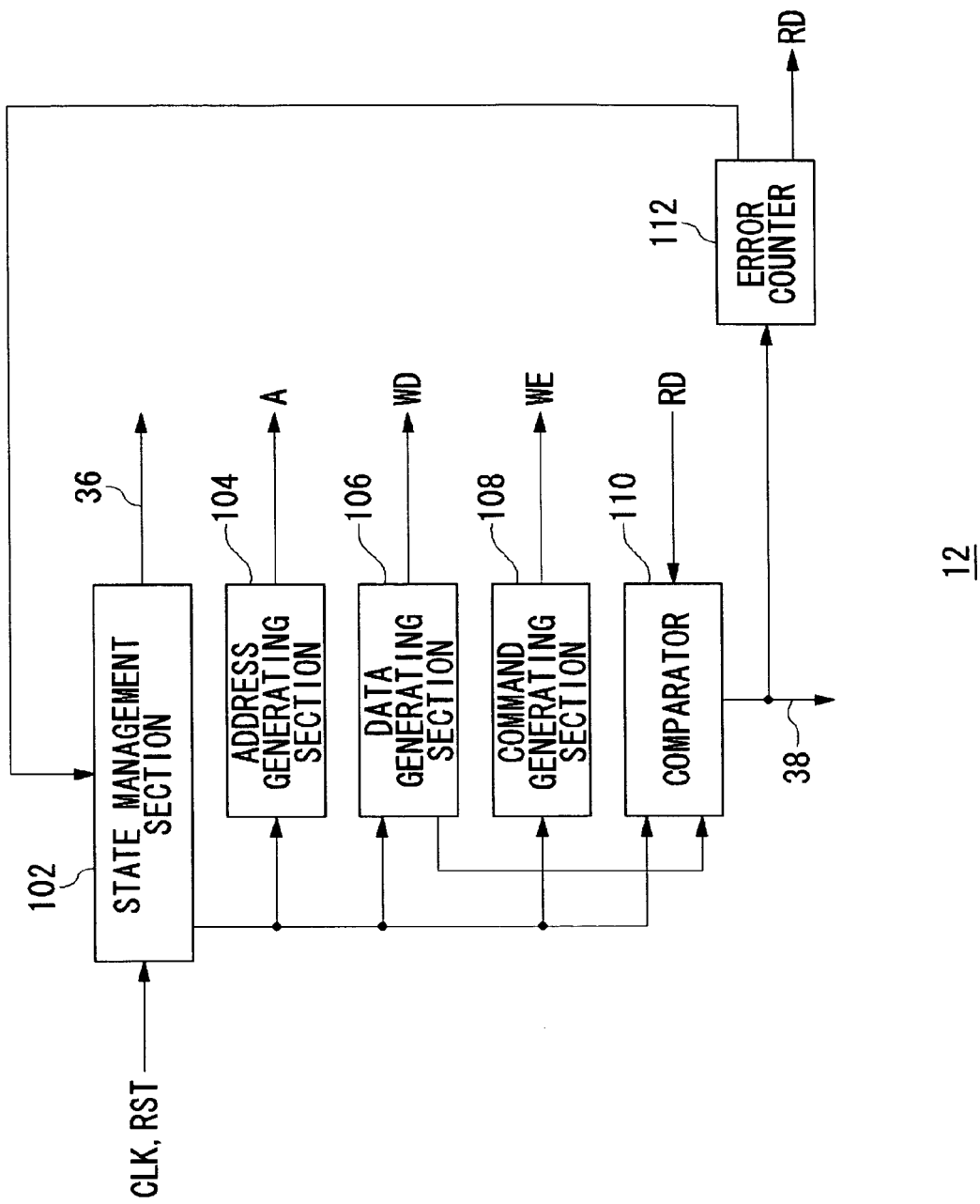
FIG. 3 is a view showing the internal configuration of a test circuit.

FIG. 3 shows the internal configuration of the test circuit 12. A state management section 102 controls the entire operation of the test circuit 12 and asserts the test signal 36 during a test. A state is reset using a reset input RST and proceeds in response to a clock input CLK. Under the control of the state management section 102, an address generating section 104, a data generating section 106, and a command generating section 108 generate an address, test data, and a write or read command that are required for each state, respectively.

For an address matching test, the address generating section 104 includes a counter (not shown) which can be incremented or decremented. A comparator 110 compares a read value of test data with its expected value, and if there is no match between both the values, then asserts the error detection signal 38 assuming that an error address has been detected. An error counter 112 keeps count of error detections, and if the count value exceeds the number of alternative cells prepared, and then notifies the state management section 102 thereof. When having received the notification, the state management section 102 forces the termination of the test. The error counter 112 is provided as a system register that can read a count value from the processor, and the processor can know the number of errors and the presence of a forced termination due to an error as a result of a test. For example, testing by the test circuit 12 can be performed in accordance with the following states in which the test circuit 12 will:

1. write all zeros from address 00 to a final address;
2. write all ones while reading (the all zeros) from address 00 to the final address;
3. check the read data by comparison if it is all zeros;
4. write all zeros while reading (the all ones) from the final address to address 00;
5. check the read data by comparison if it is all ones;
6. write all ones from address 00 to the final address;
7. write all zeros while reading (the all ones) from address 00 to the final address;
8. check the read data by comparison if it is all ones;
9. write all ones while reading (the all zeros) from the final address to address 00;
10. check the read data by comparison if it is all zeros;
11. end the BIST on all the RAMs; and
12. force the termination of the BIST if the number of errors exceeds the number of alternative cells.

Figure 4:
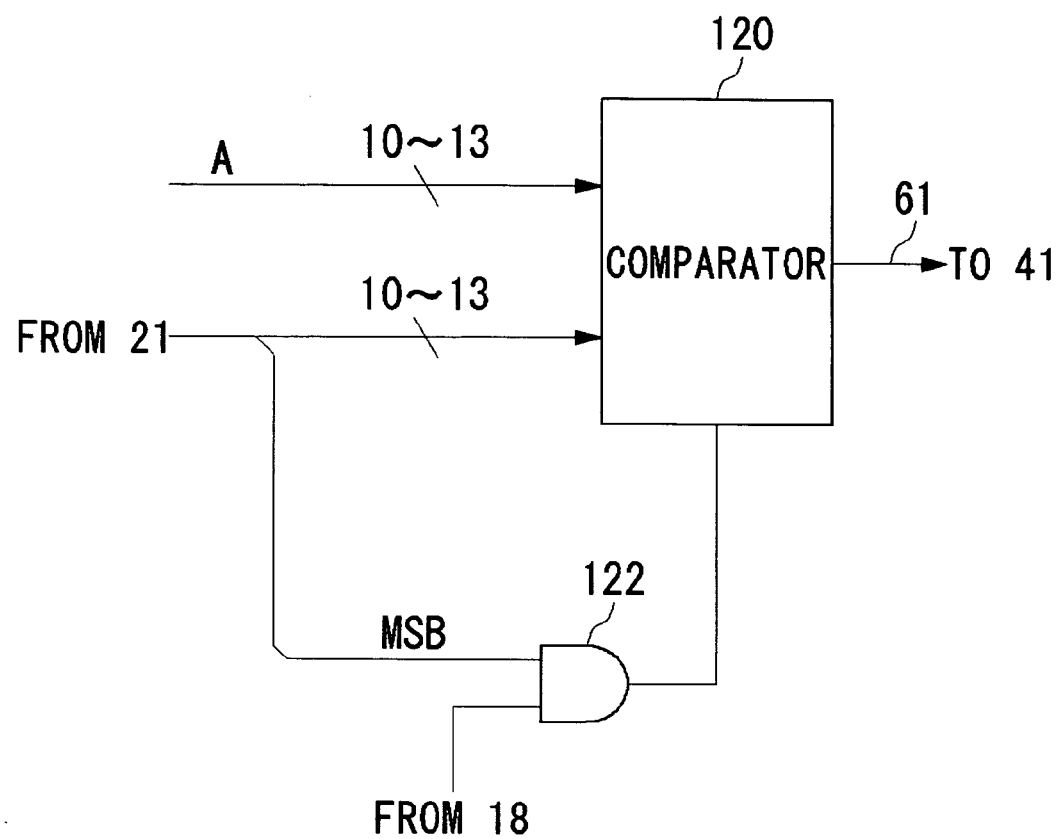
FIG. 4 is a view showing the internal configuration of a first address comparator.

FIG. 4 illustrates the internal configuration of the first address comparator 31. In FIG. 4, it is assumed that the size of RAMS is 1 to 8 kilo-bytes and addresses to be supplied thereto have one of the sizes of 10 to 13 bits. A comparator 120 compares an address "A" being delivered by the processor with an error address stored in the first error address register 21. However, to avoid a coincident match between both the addresses when no valid error address is written in the first error address register 21, the comparator 120 utilizes the most significant bit MSB in the first error address register 21 as an "error presence flag." The first error address register 21 is configured to make the MSB zero after having been reset, and if the test circuit 12 has detected an error, then writes one to the MSB and an error address at the same time. Accordingly, the MSB is one only when the error address stored in the first error address register 21 is valid.

Furthermore, since the BIST operation needs to be permitted by the enable register 18, an output from the enable register 18 and the MSB are supplied to an AND gate 122, an output from which enables the comparator 120. Only with the comparator 120 enabled, the first error cell access signal 61 will be asserted when there is a match between both the addresses supplied.

Figure 5:
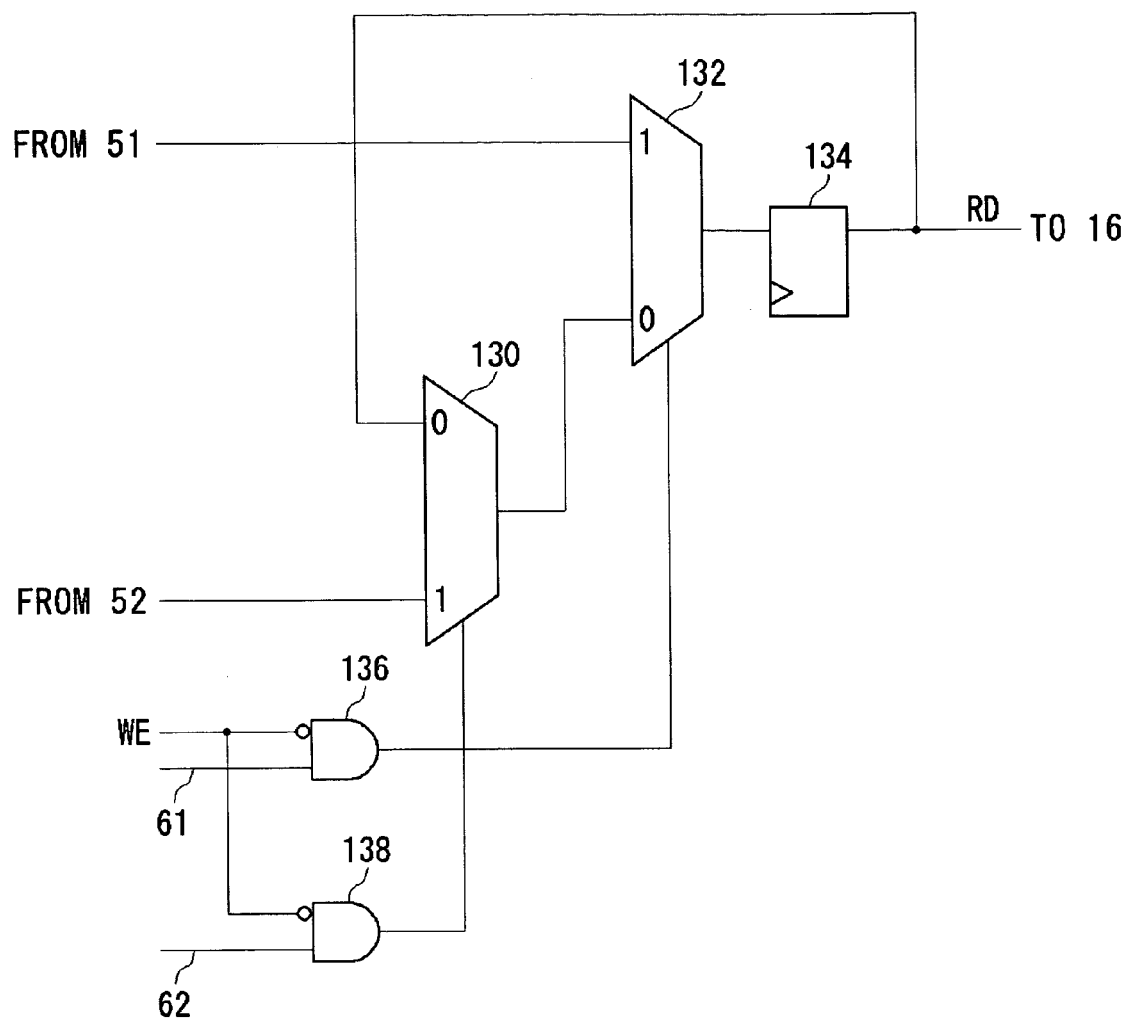
FIG. 5 is a view showing the internal configuration of a register selector.

FIG. 5 shows the internal configuration of the register selector 20. The register selector 20 has a first selector 130 and a second selector 132, which are controlled by a first AND gate 136 and a second AND gate 138, respectively. The first AND gate 136 and the second AND gate 138 are supplied with the "WE" and the first error cell access signal 61 and the "WE" and the second error cell access signal 62, respectively.

The first AND gate 136 provides a High output when "WE" is at Low and the first error cell access signal 61 is at High, i.e., when an error address is read for which the first correction register 51 is responsible. This allows for outputting data labeled with "1" at the second selector 132 and delivered from the first correction register 51. The second AND gate 138 provides a High output when "WE" is at Low and the second error cell access signal 62 is at High, i.e., when an error address is read for which the second correction register 52 is responsible. This allows for outputting data labeled with "1" at the first selector 130 and delivered from the second correction register 52. At this time, since the output from the first AND gate 136 is at Low, the second selector 132 selects a path labeled with "0" and connected to the first selector 130, thereby allowing data from the second correction register 52 to be output from the second selector 132.

A latch 134 holds the output from the second selector 132 and delivers the output to the input labeled with "0" of the first selector 130. When the outputs from the first and second AND gates 136 and 138 are both at Low, i.e., when an alternative cell needs not output data, the data stored in the latch 134 is maintained in the loop of the first selector 130, the second selector 132, and the latch 134. The register selector 20 configured as described above allows data to be properly selected from a necessary alternative cell and then delivered to the read selector 16.

Figure 6:
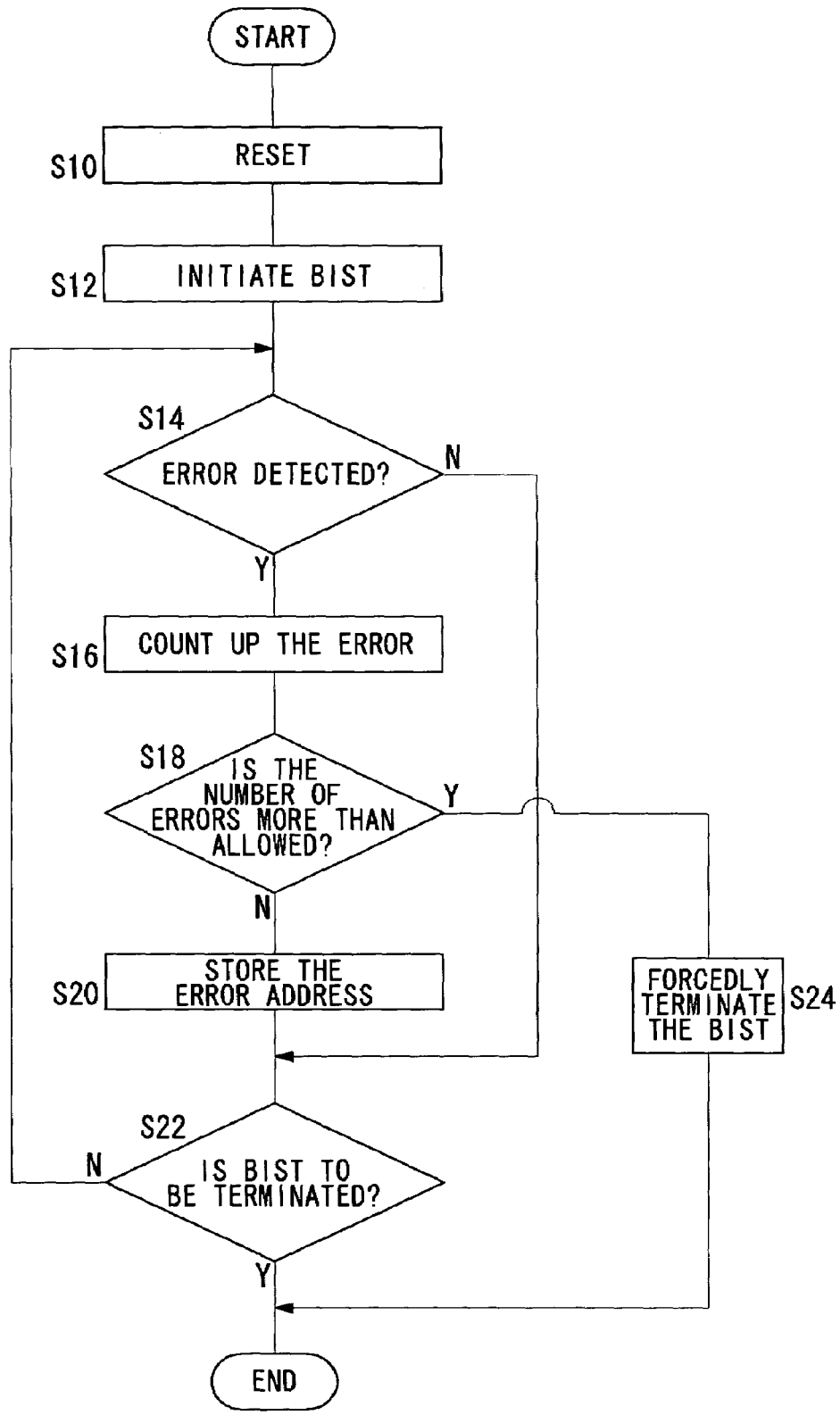
FIG. 6 is a flowchart showing a BIST processing procedure according to the embodiment.

Now, the operation performed in the aforementioned configuration will be described below. FIG. 6 shows a BIST processing procedure. First, the memory device 100 is turned on or otherwise reset by hardware or software control (S10). This triggers the state management section 102 in the test circuit 12 to initiate state control, starting a BIST (S12). Since the test signal 36 is asserted during the BIST, the write selector 14 selects the test circuit 12. In a write operation during the BIST, the test circuit 12 delivers "WD," "A," and "WE" to the memory block 10. On the other hand, in a read operation, read data from the memory block 10 is supplied to the comparator 110 in the test circuit 12 to check for an error.

While the BIST is being performed as described above, a detection of an error ("Y" in S14) causes the error counter 112 to count up the error (S16). As a result, when the number of errors exceeds the number of alternative cells ("Y" in S18), the BIST is forced to terminate (S24). When the number of errors is less than or equal to the number of alternative cells ("N" in S18), the error addresses are stored in the first error address registers 21 or the second error address registers 22 (S20). If the condition for terminating the BIST is satisfied at this stage ("Y" in S22), the process terminates the BIST, or if not ("N" in S22), the process returns to S14 to continue the test.

Figure 7:
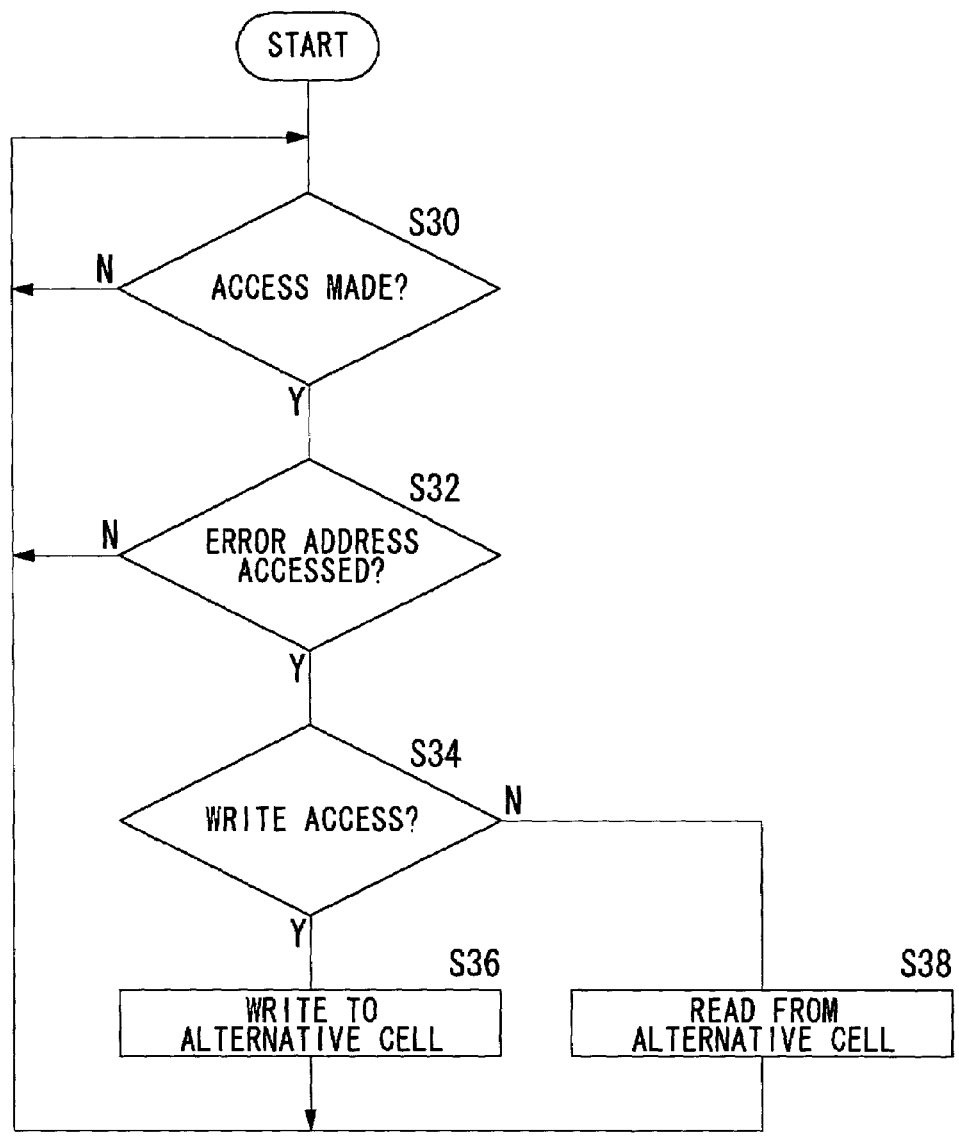
FIG. 7 is a flowchart showing the procedure of a normal operation after the BIST according to the embodiment.

Now, a description is given to the normal operation which is performed after the BIST has been terminated. FIG. 7 shows the procedure of the normal operation. Since the BIST has been terminated, the test circuit 12 does not operate with the write selector 14 having selected the write bus 24. Unless access is made by the processor ("N" in S30), the memory device 100 is in a standby status.

When access is made by the processor ("Y" in S30), the first and second address comparators 31 and 32 determine whether the address being accessed is an error address (S32). If not, then the process returns to a standby status ("N" in S32), or if true, then the first error cell access signal 61 or the second error cell access signal 62 is asserted. This causes the read selector 16 to select not the output from the memory block 10 but the output from the register selector 20 for delivery to the read bus 26, thus preparing for a read operation. When access is made to the error address for a write operation ("Y" in S34) while monitoring "WE," the first write logic circuit 41 writes "WD" to an alternative cell, i.e., the first correction register 51 or the second correction register 52 (S36). On the other hand, since the access is a read access if not a write access ("N" in S34), the process returns the data from a relevant register, i.e., from either the first correction register 51 or the second correction register 52, to the processor via the register selector 20 and the read selector 16 (S38).

The aforementioned embodiment provides the following advantages.

First, a test can be conducted in a short period of time because the BIST is hardware controlled within the memory device 100. Additionally, there is neither any need to impose load on the processor nor to run a program for the test.

Furthermore, only a few alternative cells may be sufficiently prepared for the memory block 10. It is thus possible to realize a memory device with a significantly reduced amount of increase in hardware as compared with one that provides a parity bit and as well makes error corrections.

On the other hand, in a typical memory test prior to shipment, an error cell found would be forcedly replaced with another cell, in the case of which a fuse or a conductor is permanently cut off for the replacement. However, such a method cannot address an error which may occur after shipment. In this context, a memory device according to the embodiment of the invention allows for dynamically addressing an error that may occur after shipment and is thus highly practical. As a mater of course, the method according to the embodiment could also address an error cell present at the time of shipment, thus having no disadvantages as compared with the conventional method.

In addition, since an alternative cell is placed outside the memory block 10, the memory block 10 itself can be utilized as in the conventional manner without any redundancy, thus providing a design merit.

An embodiment of the present invention has been described above in accordance with the embodiment. It is to be understood by those skilled in the art that this embodiment is only illustrative, and various modifications and changes can be made to the combination of its components without departing from the scope and spirit of the present invention. Now, some of the modified examples will be described below.

According to the embodiment, only the memory device 100 or the combination of the memory device 100 and the processor is implemented in a single integrated circuit device. However, as a matter of course, this configuration can be realized with more flexibility. For example, any component in FIG. 1 may be integrated in the LSI or implemented external thereto.

In the embodiment, the entity that utilizes the memory block 10 was simply defined as a "processor." For example, this processor may be a CPU (Central Processing Unit) of a display device or other control device, in the case of which another application may be conceivably available which utilizes the memory device 100 as a display memory. For example, an error cell present in the display memory would cause a dot dropout, which may be likely recognized as a defect by the user upon display on the LCD. Using the memory device 100 according to the embodiment as a display memory would allow the error cell to be recovered, thereby effectively making it possible to avoid not only a defect in the display memory but also a defect of the LCD or other defects of the display device itself.

According to the embodiment, the alternative cell circuit was considered to be a "bypass circuit" in the description with reference to FIG. 2. However, the bypass circuit can also be interpreted in other ways. For example, the bypass circuit may be considered to be only the first correction register 51 and the second correction register 52; only the first address comparator 31 and the second address comparator 32 in addition to the aforementioned components; or only the first error address register 21 and the second error address register 22 in addition to the aforementioned components.

While the preferred embodiments of the present invention have been described using specific terms, such description is for illustrative purposes only, and it is to be understood that changes and variations may be made without departing from the spirit or scope of the appended claims.

What is claimed is:

1. A memory device comprising:
 a main memory block having an arrangement of regular memory cells;
 a test circuit which performs a self-test of the regular memory cells in memory blocks;
 an external memory block provided external to the main memory block, the external memory block including alternative cells, one of which replaces one of the regular memory cells which has been found to be erroneous as a result of the self-test;
 a bypass circuit which switches access to the main memory block to access to the external memory block when one of the regular memory cells has been found to be erroneous; and
 an enable register which permits the operation of the test circuit:
 the bypass circuit comprises:
 an error address storage circuit which stores the address of the erroneous memory cell;
 a comparator circuit which compares a currently accessed address with an address stored in the error address storage circuit; and
 a switching circuit which changes an access destination to the alternative cell when there is a match between both the addresses to be compared in the comparator circuit;
 wherein the most significant bit in the error address storage circuit is utilized as an error presence flag and the most significant bit and an output from the enable register are supplied to a gate, so as to enable the comparator by the output of the gate.

2. The memory device according to claim 1, wherein the alternative cell in the external memory is made up of a register circuit.

3. The memory device according to claim 1, wherein the alternative cell is provided for each region in the memory block.

4. The memory device according to claim 3, wherein a number of the alternative cells is determined for each region of the memory block depending on a size of each of the regions.

5. The memory device according to claim 1, wherein the test circuit keeps count of the error detections, and if the count exceeds the number of the alternative cells, then terminates the self-test.

6. The memory device according to claim 1, wherein a predetermined bit of an error address storage circuit is employed as an error presence flag.

7. The memory device according to claim 6, wherein the error address storage circuit is reset to then turn the predetermined bit into an inactive signal, and if the test circuit detects an error, then writes an active signal to the predetermined bit.

8. A display device comprising:
a display memory; and
a control circuit which reads data from the display memory for display,
the display memory comprising:
a main memory block having an arrangement of regular memory cells;
a test circuit which performs a self-test of the regular memory cells in the memory block;
an external memory block provided external to the main memory block, the external memory block including alternative cells, one of which replaces one of the regular memory cells which has been found to be erroneous as a result of the self-test;
a bypass circuit which switches access to the main memory block to access to the external memory block when one of the regular memory cells has been found to be erroneous; and
an enable register which permits the operation of the test circuit;
the bypass circuit comprises:
an error address storage circuit which stores the address of the erroneous memory cell;
a comparator circuit which compares a currently accessed address with an address stored in the error address storage circuit; and
a switching circuit which changes an access destination to the alternative cell when there is a match between both the addresses to be compared in the comparator circuit;
wherein the most significant bit in the error address storage circuit is utilized as an error presence flag and the most significant bit and an output from the enable register are supplied to a gate, so as to enable the comparator by the output of the gate.

9. The memory device according to claim 8, wherein the alternative cell is provided for each region in the memory block.

10. The memory device according to claim 9, wherein a number of the alternative cells is determined for each region of the memory block depending on a size of each of the regions.

11. The memory device according to claim 8, wherein the test circuit keeps count of the error detections, and if the count exceeds the number of the alternative cells, then terminates the self-test.

12. The memory device according to claim 8, wherein a predetermined bit of an error address storage circuit is employed as an error presence flag.

13. The memory device according to claim 12, wherein the error address storage circuit is reset to then turn the predetermined bit into an inactive signal, and if the test circuit detects an error, then writes an active signal to the predetermined bit.

* * * * *